Dec. 28, 1954

E. EBERHARD ET AL 2,698,386

PUSH-PULL SINE WAVE OSCILLATOR

Filed Nov. 21, 1950

INVENTOR
Everett Eberhard
& Richard O. Endres
BY H. W. Muston
ATTORNEY

United States Patent Office 2,698,386

Patented Dec. 28, 1954

2,698,386

PUSH-PULL SINE WAVE OSCILLATOR

Everett Eberhard, Phoenix, Ariz., and Richard O. Endres, Morristown, N. J., assignors to Radio Corporation of America, a corporation of Delaware Application November 21, 1950, Serial No. 196,808

4 Claims. (Cl. 250—36)

Figure 1:
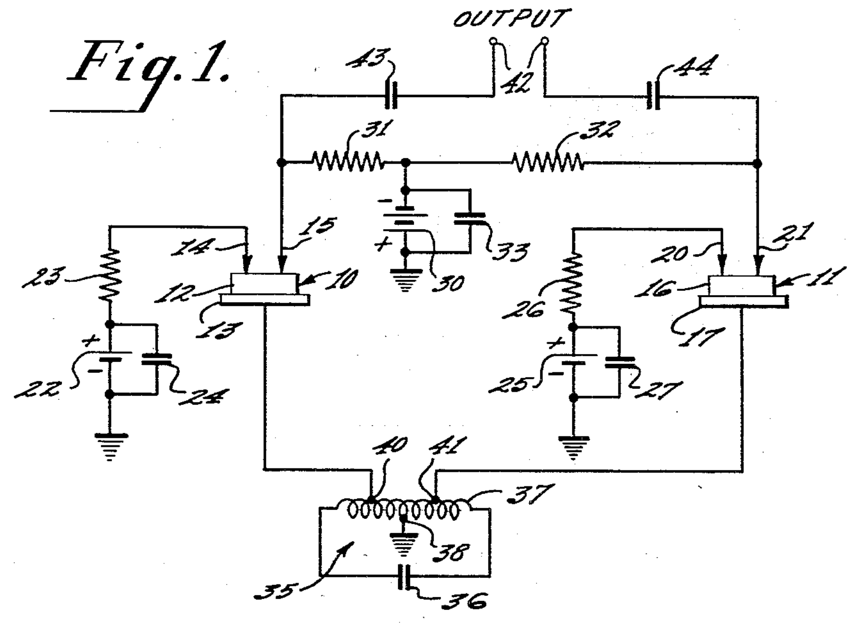

This invention relates generally to oscillators, and particularly relates to oscillators of the push-pull sine-wave type. A primary object of this invention is to provide an improved oscillator of the type referred to which effectively utilizes a pair of semi-conductor devices.

Such semi-conductor devices may be considered to comprise a semi-conducting body such as a crystal of silicon or germanium provided with a base electrode, an emitter electrode and a collector electrode in contact with the body. Devices of this type are usually called transistors. It is well known that a transistor may be used in an amplifier or oscillator circuit. A transistor oscillator circuit without an external feedback path has been disclosed and claimed in the copending application to Eberhard, Serial No. 73,352, filed on January 28, 1949, entitled "Sine Wave Oscillators" and assigned to the assignee of this application. This copending application discloses a two terminal sine wave oscillator having a parallel resonant circuit connected between the base electrode of the transistor and ground. Other types of transistor sine wave oscillators have been disclosed in a copending application to Eberhard, Serial No. 93,303, filed May 14, 1949, now Patent No. 2,675,474, entitled "Two Terminal Sine Wave Oscillators" and assigned to the assignee of this application.

The operation of the sine-wave oscillator disclosed in the Eberhard application, Serial No. 73,352 has been discussed in a paper by Webster, Eberhard, and Barton, which appears on pages 5 to 16 of the March 1949 issue of "RCA Review" (see particularly Figure 10 on page 14). Such a transistor sine wave oscillator operates by virtue of the negative resistance, which a transistor exhibits under certain operating conditions. The voltage developed across the resonant circuit of the oscillator controls the negative resistance, and the amplitude of the oscillatory wave is limited by the characteristics of the transistor as well as by the external impedance connected thereto.

The present invention relates to an improved transistor push-pull oscillator. It is well known that a push-pull oscillator has an improved efficiency and will provide a higher power output.

It is accordingly an object of the present invention to provide an improved sinusoidal oscillator of the semi-conductor type, which has a higher efficiency and a larger power output than previously known semi-conductor sine-wave oscillators.

A further object of the invention is to provide an improved push-pull sine-wave oscillator employing a pair of transistors and which has additional external feedback, thereby to improve its operation and its stability.

A push-pull sine-wave oscillator in accordance with the present invention comprises essentially a pair of transistors and a parallel resonant circuit coupled to the base electrodes of the two transistors or semi-conductor devices.

The parallel resonant circuit has an intermediate point which is grounded and two taps disposed symmetrically with respect to the grounded intermediate point and each of the taps is connected to one of the base electrodes. Load impedance elements such as resistors are connected to the collector electrodes. A sinusoidal output wave balanced with respect to ground and at a frequency determined by that of the resonant circuit may be derived from the collector resistors.

It is also feasible to couple the emitter electrodes to the parallel resonant circuit which is connected to the base electrodes. This provides external feedback paths between base and emitter electrodes, thereby to improve the efficiency of the oscillator.

Figure 2:
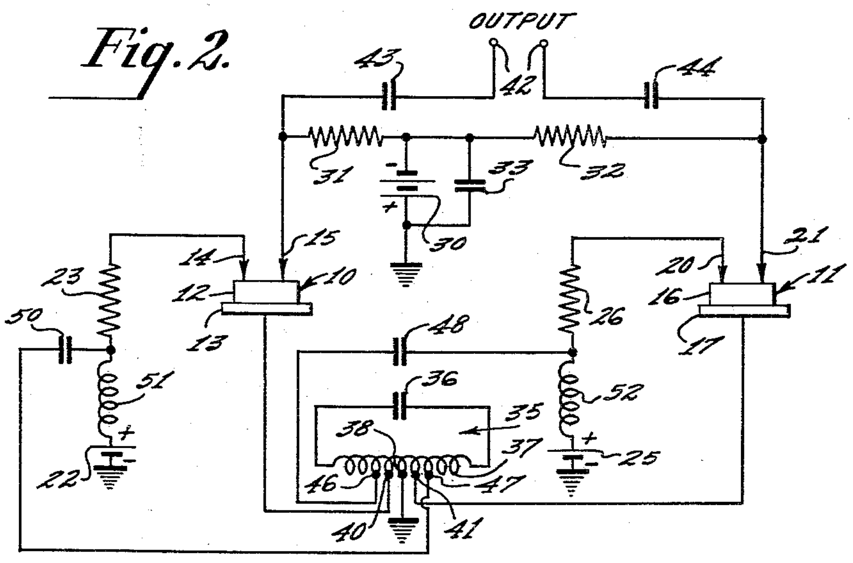

The novel features that are considered characteristic of this invention are set forth with particularly in the appended claims. The invention itself, however, both as to its organization and method of operation, as well as additional objects and advantages thereof, will best be understood from the following description when read in connection with the accompanying drawing, in which:

Figure 1 is a circuit diagram of a semi-conductor push-pull sine-wave oscillator embodying the invention; and Figure 2 is a circuit diagram of a push-pull sine-wave oscillator having additional external feedback paths in accordance with the invention.

Referring now to the drawing, in which like components have been designated by the same reference numerals throughout the figures, and particularly to Figure 1, there is illustrated a sine-wave oscillator comprising a pair of semi-conductor devices 10 and 11. Semi-conductor device 10 includes semi-conducting body 12 which may, for example, consist of a crystal of silicon or preferably of germanium. Body 12 preferably is of the N type although it may be of the P type. One of the surfaces of body 12 may be treated in a conventional manner by polishing and etching it.

Base electrode 13, emitter electrode 14 and collector electrode 15 are in contact with body 12. Base electrode 13 is in low-resistance contact with body 12 and may be a large area electrode. Emitter 14 and collector 15 are in rectifying contact with body 12 and may consist of point or line contact electrodes. Semi-conductor device 11 consists of semi-conducting body 16, base electrode 17, emitter electrode 20 and collector electrode 21.

In order to provide operating potentials for device 10 and 11, a voltage in the forward direction is applied between each emitter 14 and 20 and its associated base electrode 13 and 17 respectively. If bodies 12 and 16 are of the N type, emitters 14 and 20 should be positive with respect to bases 13 and 17 respectively. If bodies 12 and 16 should be of the P type, the polarity of the emitter voltages should be reversed. In order to apply the forward voltage between emitter 14 and base 13, there may be provided battery 22 having its negative terminal grounded, while its positive terminal is connected to emitter 14 through resistor 23. Resistor 23 is not necessary for the operation of the oscillator of the invention. However, it serves to limit the emitter current and should have a small value of the order of 100 ohms. Battery 22 may be bypassed for alternating frequency currents by capacitor 24.

Similarly battery 25 has its positive terminal connected to the emitter 20 through resistor 26 to provide the required forward bias for the emitter 20. The negative terminal of battery 25 may be grounded as shown, and the battery may be bypassed for alternating frequency currents by capacitor 27. It is to be understood that one of the batteries 22 or 25 may be omitted and that the emitter bias voltage may be applied to both emitter 14 and 20 from the same battery. Alternatively, a bias network may be connected between each emitter 14 or 20 and its associated base 13 or 17 respectively as is well known.

Furthermore, a voltage in the reverse direction is applied between each collector 15 and 21 and its associated base electrode 13 and 17 respectively. If we assume again that bodies 12 and 16 are of the N type collectors 15 and 21 should be maintained at a negative potential with respect to their base electrodes 13 and 17. Again if bodies 12 and 16 should be of the P type, the polarity of the collector voltage should be reversed.

For the purpose of applying a voltage in the reverse direction, between each collector 15 and 21 and its base electrode 13 and 17 respectively there may be provided a battery 30 having its positive terminal grounded. The negative terminal of battery 30 is connected individually to collectors 15 and 21 through resistors 31 and 32 respectively, which function as load impedance elements. Battery 30 may be bypassed for alternating frequency currents by capacitor 33.

A parallel resonant circuit 35 is coupled to base electrodes 13 and 17. Parallel resonant circuit 35 comprises capacitor 36 and inductor 37. Inductor 37 has an intermediate point 38 such as its midpoint connected to ground, that is, to the negative terminals of batteries 22, 25 and to the positive terminal of battery 30. Two taps 40 and 41 are disposed symmetrically with respect to midpoint 38 and are connected respectively to base electrodes 13 and 17.

An output signal may be derived from output terminals 42, which are coupled by capacitors 43 and 44 to collector electrodes 15 and 21 respectively. The output signal is accordingly derived across load resistor 31, 33 and is a sinusoidal wave at a frequency determined by the resonant frequency of parallel resonant circuit 35. The output wave obtained from output terminals 42 is balanced with respect to ground.

The oscillator of Figure 1 operates in the manner disclosed in the copending Eberhard applications above referred to, and as explained in the paper by Webster, Eberhard, and Barton cited above. In view of the fact that a parallel resonant circuit is connected to each base electrode 13 and 17, the semi-conductor devices 10 and 11 operate in a regenerative condition. The magnitude of the regeneration is controlled by the voltage developed between tap 40 and midpoint 38 or between tap 41 and midpoint 38 of inductor 37. The amplitude of the thus developed sinusoidal wave is limited by the magnitude of the load resistors 31 and 32 and by the characteristics of devices 10 and 11. In view of the fact that the voltage developed to the right of mid-point 38 is 180 degrees out of phase with respect to that developed to the left of midpoint 38 in inductor 37, the two semi-conductor devices 10 and 11 are operated in push-pull.

Preferably base electrodes 13 and 17 are not connected to the terminals of parallel resonant circuit 35, but to intermediate taps 40 and 41 in order to match the impedance of base electrodes 13 and 17 to that of parallel resonant circuit 35.

If the external impedance of the emitter circuit of the oscillator of Figure 1 is small for the oscillatory energy, the oscillator path is shunted by a low-resistance path which might reduce the Q of the parallel resonant circuit 35. As explained hereinbefore, the impedances of the base electrodes can be matched to that of parallel resonant circuit 35. Alternatively, the external emitter impedance, that is, the resistance of resistors 23 and 26 may be increased to lessen the loading on parallel resonant circuit 35.

Figure 2 illustrates a push-pull sine-wave oscillator having an external feedback path between the base electrode 13 of device 10 and the emitter electrode 20 of device 11 as well as another external feedback path between the base electrode 17 of device 11 and emitter electrode 14 of device 10. To this end, two further taps 46 and 47 are provided on inductor 37 of parallel resonant circuit 35.

Accordingly, two pairs of taps 40, 46 and 41, 47 are provided on inductor 37. Each pair of taps 40, 46 and 41, 47 is disposed on one side of midpoint 38 and may be arranged symmetrically with respect to midpoint 38. If devices 10 and 11 are dissimilar, the taps may be disposed unsymmetrically to match their different characteristics. Taps 40 and 41 are again connected to base electrode 13 and 17 respectively. Tap 46 is coupled through capacitor 48 and resistor 26 to emitter electrode 20. Similarly, tap 47 is coupled through capacitor 50 and resistor 23 to emitter electrode 14.

Preferably, a choke coil 51 is connected between the positive terminal of battery 22 and resistor 23. Without the choke coil 51, the junction point of capacitor 50 and resistor 23 would be grounded for alternating frequency currents and, therefore, the feedback path between emitter 14 and base 17 would be grounded for the oscillatory energy. Similarly, choke coil 52 is provided between the positive terminal of battery 25 and resistor 26. It should be understood that coils 51 and 52 may be replaced by equivalent resistors with a small loss in the amount of regeneration.

The oscillator of Figure 2 operates in substantially the same manner as that of Figure 1. A fraction of the energy developed across the portion of inductor 37 to the right of midpoint 38 is fed back through tap 47, capacitor 50 and resistor 23 to emitter electrode 14. It will, of course, be evident that the voltages of emitter 14 and base 13 are 180 degrees out of phase. This is due to the basic fact that an increase of the emitter voltage will cause a larger collector current flow. A portion of the larger collector current will flow through the base electrode and also through the external base impedance. Accordingly, the voltage of the base electrode will be driven in a negative direction when the emitter voltage becomes more positive. Since the voltage developed across the portion of inductor 37 to the right of midpoint 38 is out of phase with that developed across the portion of the inductor to the left of point 38, the voltage fed back through capacitor 50 to emitter 14 will be out of phase with the voltage of its base electrode 13.

In a similar manner the voltage fed back from tap 46 through capacitor 48 and resistor 26 to emitter 20 will also be out of phase with respect to the voltage at base 17. The feedback provided by capacitors 48 and 50 is accordingly regenerative and promotes oscillations.

The amount of feedback to the respective emitters obtained in the circuit of Figure 2 is determined by the ratio of the number of turns of inductor 37 between midpoint 38 and one of its terminals and the number of turns between midpoint 38 and tap 46 or tap 47.

There has thus been disclosed a push-pull sine-wave oscillator of the semi-conductor type. The oscillator has a greater stability, a higher power output, and a higher efficiency than previously known semi-conductor sine-wave oscillators.

What is claimed is:

1. A push-pull sine-wave oscillator comprising a pair of semi-conducting devices, each including a semi-conducting body, a base electrode, an emitter electrode and a collector electrode in contact with said body, means for applying a voltage in the forward direction between each emitter electrode and its associated base electrode and for applying a voltage in the reverse direction between each collector electrode and its associated base electrode, a resonant circuit including a capacitor and an inductor connected in parallel, means for maintaining an intermediate point of said inductor at substantially a fixed ground potential, two pairs of taps provided on said inductor, each pair of taps being disposed on one side of said intermediate point and said pairs being arranged symmetrically with respect to said intermediate point, each pair of taps being coupled respectively to the base electrode of one of said devices and to the emitter electrode of the other one of said devices, a load impedance element connected to each of said collector electrodes, and an output circuit coupled to both of said load impedance elements for deriving a sinusoidal wave at a frequency determined by the resonant frequency of said resonant circuit.

2. A push-pull sine-wave oscillator comprising a pair of semi-conducting devices, each including a semi-conducting body, a base electrode, an emitter electrode and a collector electrode in contact with said body, means for applying a voltage in the forward direction between each emitter electrode and its associated base electrode and for applying a voltage in the reverse direction between each collector electrode and its associated base electrode, a resonant circuit including a capacitor and an inductor connected in parallel, means for maintaining an intermediate point of said inductor at substantially a fixed potential with respect to the terminal ends thereof, two pairs of taps provided on said inductor, each pair of taps being disposed on one side of said intermediate point and said pairs being arranged symmetrically with the respect to said intermediate point, each pair of taps being coupled respectively to the base electrode of one of said devices and to the emitter electrode of the other one of said devices, thereby to provide external feedback paths to said emitter electrodes, a load resistor connected to each of said collector electrodes, and an output circuit coupled to said load resistors for deriving a sinusoidal wave at a frequency determined by the resonant frequency of said resonant circuit.

3. A push-pull sine wave oscillator comprising a first and a second semi-conductor device, each including a semi-conducting body, a base electrode, an emitter electrode and a collector electrode in contact with said body, means for applying a voltage in the forward direction between each emitter electrode and its associated base electrode and for applying a voltage in the reverse direction between each collector electrode and its associated base electrode, a resonant circuit including a capacitor and an inductor connected in parallel, a first, a second, a third, a fourth and a fifth tap provided on said inductor, said first and second taps being spaced symmetrically from said third tap with respect to said fourth and fifth taps, means for maintaining said third tap at substantially a fixed potential with respect to the other taps, a first capacitor connecting said first tap to the emitter electrode of said second device, said second tap being connected to the base electrode of said first device, said fourth tap being connected to the base electrode of said second device, a second capacitor connecting said fifth tap to the emitter electrode of said first device, a load resistor connected between each of said collector electrodes and said third tap, and an output circuit coupled to said load resistor for deriving a sinusoidal wave at a frequency determined by the resonant frequency of said resonant circuit.

4. A push-pull sine wave oscillator comprising a first and a second semi-conductor device, each including a semi-conducting body, a base electrode, an emitter electrode and a collector electrode in contact with said body, means for applying a voltage in the forward direction between each emitter electrode and its associated base electrode and for applying a voltage in the reverse direction between each collector electrode and its associated base electrode, a resonant circuit including a capacitor and an inductor connected parallel, a first, a second, a third, a fourth and a fifth tap provided on said inductor, said first and second taps being spaced symmetrically from said third tap with respect to said fourth and fifth taps, means for maintaining said third tap at substantially a fixed ground potential, a first capacitor connecting said first tap to the emitter electrode of said second device, said second tap being connected to the base electrode of said first device, said fourth tap being connected to the base electrode of said second device, a second capacitor connecting said fifth tap to the emitter electrode of said first device, thereby to provide external feedback paths between said emitter electrodes and said resonant circuit, a load resistor connected between each of said collector electrodes and said third tap, a further resistor connected between each of said emitter electrodes and said first and second capacitors respectively, and an output circuit coupled to said load resistor for deriving a sinusoidal wave at a frequency determined by the resonant frequency of said resonant circuit.

References Cited in the file of this patent

UNITED STATES PATENTS

| Number | Name | Date |
|---|---|---|
| 1,966,616 | David | July 17, 1934 |
| 2,490,081 | Mittelmann | Dec. 6, 1949 |
| 2,524,035 | Bardeen et al. | Oct. 3, 1950 |
| 2,569,345 | Shea | Sept. 25, 1951 |
| 2,652,460 | Wallace | Sept. 15, 1953 |

OTHER REFERENCES

R. C. A. Review—March 1949 (Pages 5–16).